United States Patent [19]

Freeman

[11] Patent Number: 4,677,312
[45] Date of Patent: Jun. 30, 1987

[54] HIGH VOLTAGE SWING OPEN COLLECTOR DRIVER

[75] Inventor: Leo B. Freeman, Poughkeepsie, N.Y.

[73] Assignee: International Business Machines Corporation, Armonk, N.Y.

[21] Appl. No.: 855,994

[22] Filed: Apr. 25, 1986

[51] Int. Cl.⁴ .................. H03K 17/10; H03K 19/086
[52] U.S. Cl. .............................. 307/200 A; 307/443; 307/454; 307/455; 307/475; 307/557; 307/264
[58] Field of Search ............... 307/200 A, 443, 450, 307/454, 455–456, 475, 540, 557–558, 254, 264; 361/88, 91

[56] References Cited

U.S. PATENT DOCUMENTS

| 3,769,524 | 10/1973 | Mathews | 307/215 |
| 3,962,590 | 6/1976 | Kane et al. | 307/214 |
| 3,974,402 | 8/1976 | Fett et al. | 307/264 |
| 4,065,683 | 12/1977 | Clarke | 307/200 A X |
| 4,069,430 | 1/1978 | Masuda | 307/450 X |
| 4,070,600 | 1/1978 | Butler et al. | 315/169 |
| 4,429,237 | 1/1984 | Cranford, Jr. et al. | 307/450 |
| 4,508,978 | 4/1985 | Reddy | 307/443 X |
| 4,543,494 | 9/1985 | Wakimoto | 361/88 X |
| 4,585,953 | 4/1986 | Gaudenzi et al. | 307/443 X |

Primary Examiner—Stanley D. Miller
Assistant Examiner—D. R. Hudspeth
Attorney, Agent, or Firm—Wesley DeBruin

[57] ABSTRACT

It is well known that the base width of a transistor has a direct bearing on transistor speed and the punch-through voltage. A solution to the transistor speed versus break down (punch through) voltage problem is disclosed. Output transistors are serially connected between power supply rails along with associated transistor base driving circuitry. The circuit arrangement ensures that the supply voltage divides between the series connected output transistors and prevents excessive voltage from being applied to each output transistor.

15 Claims, 6 Drawing Figures

HIGH VOLTAGE SWING OPEN COLLECTOR DRIVER

FIG. 1  HIGH VOLTAGE SWING OPEN COLLECTOR DRIVER

FIG. 2   HIGH VOLTAGE SWING OPEN COLLECTOR DRIVER

FIG. 3  HIGH VOLTAGE SWING OPEN COLLECTOR DRIVER

HIGH VOLTAGE SWING OPEN COLLECTOR DRIVER

BACKGROUND OF THE INVENTION

A key component in improving the speed of modern digital computers is to reduce the propagation delay of the circuits used to perform the necessary logic and communications operations. The speed or propagation delay of a circuit is ultimately limited by the speed of the individual transistors from which it is built. A fundamental limit to the speed of a transistor is given by the time required for the minority carrier distribution in the base region to respond to a change in base current and cause an amplified change in collector current. A measure of this time is given by the minority carrier base transit time $$T = W^2/2D$$

for a linear carrier distribution where
T is the base transit time,
W is the transistor base width, and
D is the carrier diffusivity in the base.

The base width is thus seen to have a direct bearing on the transistor speed and thus affects the speed of machines, such as computers, which are made from them. In order to minimize the propagation delay of a circuit, transistors with the smallest obtainable base width are required.

The logic circuits in a computer do not exist in isolation. They must be able to electrically communicate with circuits and devices made from different materials and with different operating characteristics. Examples of such interfaces would be communications with field effect transistor memory array chips and communications with sections of the machine built from industry standard 5 volt logic circuits.

These other circuits have specific electrical interface specifications in regard to voltage and current levels that must be met with the same type of devices and on the same integrated circuit chip that form the high speed digital logic circuits. A critical parameter for the devices forming the interface circuits is the transistor breakdown voltage. This voltage limits the use of the transistors to those interface applications that will not overstress the device and cause device or circuit failure. A measure of this is given by the transistor collector to emitter punch-through voltage, $$BV = (qQ/(Ke))(W + Q/(2N))$$

where
q is the magnitude of the electronic charge,
Q is the base doping,
Ke is the permittivity of the semiconductor,
W is the base width, and
N is the collector doping.

The base width is thus seen to have a direct bearing on the transistor breakdown voltage and thus limits the range of interface applications. In order to maximize the breakdown voltage of the transistor, the largest possible base width is required.

These two desirable transistor characteristics, high speed and high breakdown voltage, are seen to be in conflict. The doping concentrations and base widths that result in high speed devices severely limit the transistor breakdown voltage and thus limit the use of the transistors in interface circuit type applications. In fact, transistors presently designed for state of the art fast switching speeds are incapable of sustaining the voltage levels (three to five volts) required to interface to FET memory array chips and industry standard TTL circuits.

The conventional solution to this problem is to use special interfacing integrated circuits that can receive the levels generated by the high speed logic chips and convert them to the larger standard interface signal levels. These special interfacing integrated circuits are made by a process different from that of the high speed circuits and will support the higher voltage levels, although at a correspondingly lower performance and with greater propagation delay. This approach causes problems in the design of a high performance system not only because the interfacing circuits are manufactured by a lower performance process but because the additional circuits introduce more circuit chips both in the logic path and in the machine, causing physical packaging difficulties and total logic path and transmission line delay increases. This causes the assembled digital system to run slower and cost more than it would if the interface circuits could be integrated at will on the high speed logic chips.

My invention presents a circuit solution to the transistor speed vs. breakdown voltage problem. Transistors, formed by a process that results in maximum speed, are connected in series such that the total applied voltage divides between them. In this manner, no one transistor must support the entire voltage swing and each device is operated within its breakdown voltage rating. However, because of the multiple connection of series transistors, an arbitrarily large voltage swing may be built up, satisfying any interfacing requirement. Furthermore, the disclosed circuits are true digital logic circuits having only two possible output voltage levels near each power supply extreme, resulting in maximum circuit efficiency. The circuit voltage gain in each of the binary states is zero, insuring stable output levels. A most important aspect of operation of the disclosed circuits is that the series transistors maintain the voltage division even during the dynamic switching interval when the circuit output changes between the binary states. Thus the transistors are always protected from overvoltage, even while switching states from "on" to "off".

Specific embodiments of my invention are fully disclosed hereinafter. The key feature of my invention centers around an upper series connected transistor with its emitter and base resistors and base voltage dropping base-collector diode. As fully described hereinafter, these components act to control the voltage seen by the transistor and keep it within its safe operating region during switching. Several similar stages may be combined in series to increase the output swing beyond what is shown.

DESCRIPTION OF THE PRIOR ART

Previously, digital logic circuits did not have this problem since the transistor breakdown voltages were sufficient for circuit communication. However, analog circuits such as high voltage amplifiers had to face the large signal swing verses transistor breakdown voltage problem and to use a form of series connected output transistor. However, the requirement for the analog circuits are quite different from the digital logic circuit requirements. For example, analog circuits must be linear amplifier across the complete signal swing in order to minimize distortion. Digital logic circuits, on the other hand, must have an amplification (or gain) of zero at the two stable output states in order to generate the discrete logic levels. Also, digital logic circuits are designed to minimize the power dissipation by having either high current with low voltage, or high voltage with low current across them in their static states. Linear analog circuits must support high current and voltage simultaneously.

Numerous driver circuits including open collector driver circuits are known to the art. The following patents are directed to transistor switching circuits and driver circuits. It is to be appreciated, with reference to the subject invention, that the following art is not submitted to be the only prior art, the best prior art, or the most pertinent prior art.

BACKGROUND ART

U.S. Pat. Nos.

3,769,524 entitled "Transistor Switching Circuit" granted Oct. 30, 1973 to K. F. Mathews.

3,962,590 entitled "TTL Compatible Logic Gate Circuit" granted June 8, 1976 to J. Kane et al.

3,974,402 entitled "Logic Level Translator" granted Aug. 10, 1976 to D. L. Fett et al 4,070,600 entitled "High Voltage Driver Circuit" granted Jan. 24, 1978 to W. J. Butler et al.

4,251,737 entitled "Dottable Active Collector Driver Circuit" granted Feb. 17, 1981 to G. J. Gaudenzi.

SUMMARY OF THE INVENTION

A primary object of the invention is to provide digital circuitry which efficiently and reliably employs high speed transistors having narrow-base widths.

A further object of this invention is to provide digital interface circuitry which obviates the punch-through voltage and other collector to base and collector to emitter breakdown voltage problems of high speed transistors having narrow base width.

A further object is to provide an improved output stage for logic circuits employing high speed transistors having narrow base width.

A still further object is to provide improved high speed logic circuits.

The invention may be summarized as series connected output transistors connected between the power supply rails along with the associated transistor base driving circuitry that ensures that the power supply voltage divides between the series connected transistors, thus preventing excessive voltage from being applied to each transistor.

These and other features and advantages of the invention will be apparent from the following more particular description of the preferred embodiment of the invention as illustrated in the accompanying drawings

DESCRIPTION OF THE PREFERRED EMBODIMENT

Transistors with vertical structures sacrifice breakdown voltage in order to get faster transistor switching speeds, resulting in devices with a $BV_{CEO}$ of 2.5 V. ($BV_{CEO}$ is defined as the collector to emitter break down voltage with the base open.) The system power supplies ($-2.2$ V, $-0.6$ V, $0.0$ V, $+1.4$ V) have a voltage differential of 3.6 volts, sufficient to generate signal swings that can interface with industry standard TTL devices, but beyond the $BV_{CEO}$ limit of high speed (narrow base) transistors. In accordance with the invention, driver circuits herein after disclosed in detail, can generate a logic swing across the full voltage (3.6 V) without exceeding the $BV_{CEO}$ (2.5 V) of the transistors.

Figure 1:
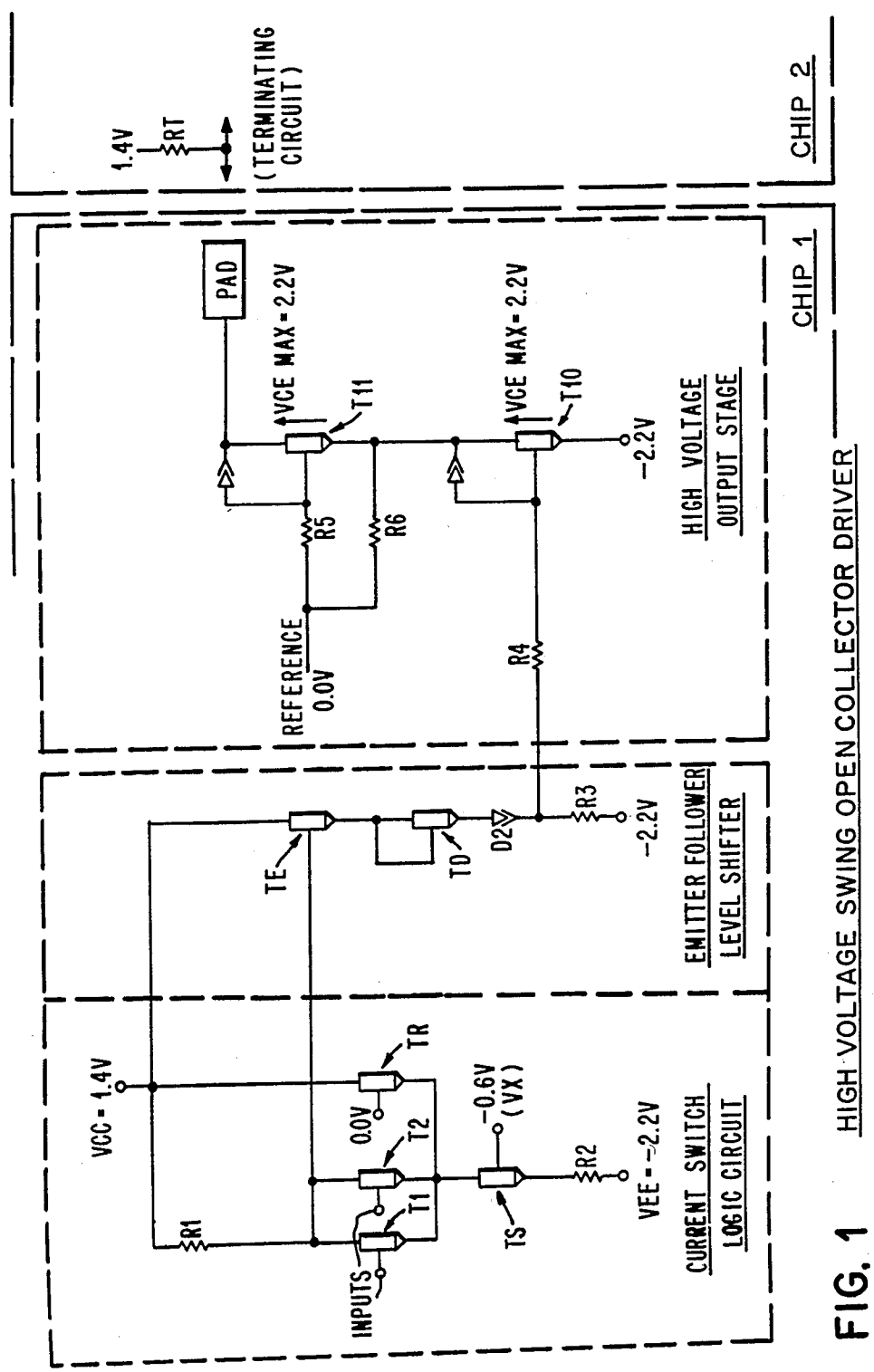
FIG. 1 discloses a first embodiment of a high voltage swing open collector driver in accordance with my invention.

In reference to the schematic diagram, FIG. 1; the input to the driver circuit may be a logic circuit such as known current switch or TTL logic circuits. Current switch logic circuits are well known to the art and accordingly no detailed discussion thereof is deemed necessary. In FIG. 1 a current switch logic circuit is shown with first and second terminals respectively connected to the bases of transistors T1 and T2. It will be appreciated that applicants' invention is not restricted to a particular type (technology family) of logic circuit nor to a logic circuit having two inputs. The collector load resistor R1 of the current switch is arranged to give the maximum collector swing without saturating the input transistor. The current switch output collectors, T1 and T2, are connected to an emitter follower level shifter circuit that drops the collector voltage swing to the most negative supply voltage, $-2.2$ V, generating the base drive current for the high voltage output stage.

The emitter-follower level shifter circuit may, as shown in FIG. 1, be comprised of the serial connection of transistor TE, diode connected transistor TD, Schottky diode D2 and resistor R3. The base of transistor TE is connected to the collectors of transistors T1 and T2. The output from the emitter-follower level shifter circuit is taken from the juncture of Schottky diode D2 and resistor R3.

Reference is made to the circuitry shown in FIG. 1 and enclosed within the broken line labelled "High Voltage Output Stage". Serially connected between an off-chip pad and a source of potential are transistors T11 and T10. The off chip pad is connected to a terminator resistor connected in turn to a source of potential ($+1.4$ V). The emitter of T11 is connected to the collector of T10. The emitter of T10 is connected to a source of potential ($-2.2$ V). The base of T11 is connected to a source of reference potential ($0.0$ V) via a resistor R5. Resistor R6 connects the emitter of T11 to the source of reference potential ($0.0$ V). The base of T10 is connected via resistor R4 to the output of the emitter follower level shifter circuit.

With no base current into transistor T10, T10 is off, $V_{BE}=0$ V, $V_{CE}=2.2$ V and transistor T11 is off, $V_{BE}=0$ V, $V_{CE}=1.4$ V. Turning on transistor T10 results in its collector voltage dropping 0.8 V, at which point it will be clamped by the turn-on of transistor T11. Transistor T10 is on, $V_{BE}=0.8$ V, $V_{CE}=1.4$ V and Transistor T11 is on, $V_{BE}=0.8$ V, $V_{CE}=2.2$ V.

Line current due to the discharge of line capacitance and due to the developing voltage across the pull-up terminator resistor RT starts to flow through the series connected transistors T11 and T10. The pad voltage drops until the anti-saturation SBD clamp on the transistor T11 begins to conduct.

As is apparent from FIG. 1 of the drawing the open collector driver and output pad are on a first chip (CHIP ONE) whereas the terminating circuit (shown in the drawing as a terminating resistor RT is on a second chip (CHIP TWO). Alternatively, both the open collector driver, the terminating circuit and the output pad could be on the same chip.
Transistor T10 is on, $V_{BE}=0.8$ V, $V_{CE}=1.4$ V and Transistor T11 is on, $V_{BE}=0.8$ V, $V_{CE}=0.2$ V.

The current through the transistor T11 SBD clamp flows through the resistor R5 in series with the base, causing a voltage drop to the base of transistor T11. As the pad voltage drops, the SBD drags the base down and the emitter of transistor T11 will drop. The emitter of transistor T11, or the collector of transistor T10, will continue to drop until the anti-saturation SBD clamp on transistor T10 begins to conduct.
Transistor T10 is on, $V_{BE}=0.8$ V, $V_{CE}=0.2$ V and Transistor T11 is on, $V_{BE}=0.8$ V, $V_{CE}=0.2$ V.

The collector of transistor T11 has moved 3.2 V with a maximum of 2.2 V appearing across the devices.

The same thing happens in reverse for turn-off. Removing the base drive from transistor T10, releases its collector, and allows it to charge up to 0.0 V. Simultaneously, transistor T11 turns off, allowing the pad to charge up to 1.4 V.

Figure 2:
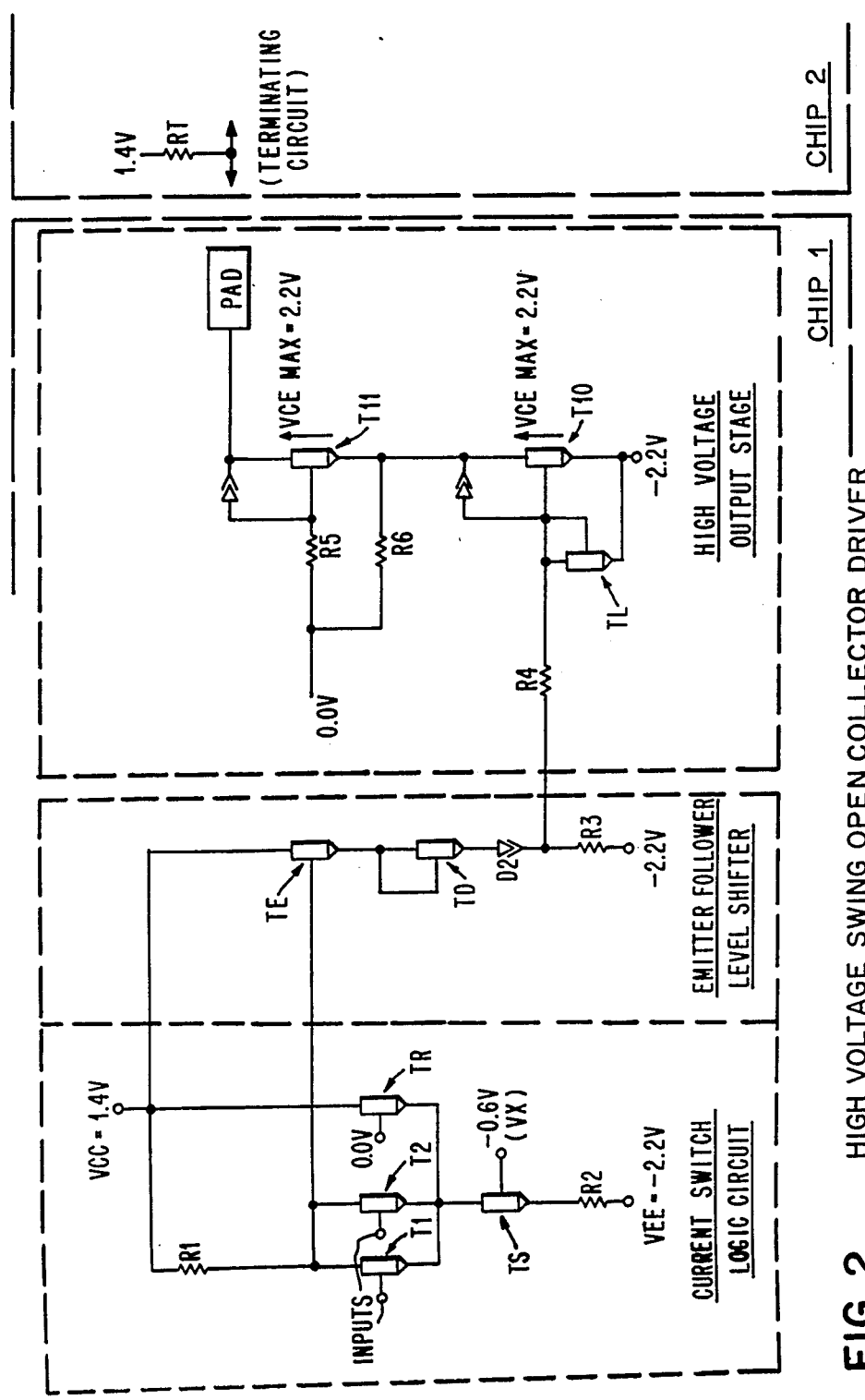
FIG. 2 discloses a second embodiment of a high voltage open collector driver in accordance with my invention.

In reference to the schematic diagram, FIG. 2; the operation is similar to that shown in FIG. 1. The difference is the introduction of diode connected transistor TL connected in parallel to the base-emitter junction of T10. The emitter of TL is connected to the emitter of T10 and the base and collector of TL are connected to the base to T10. This establishes the well known current mirror configuration where the emitter current to T10 is limited to some multiple of the emitter current of TL as determined by the ratio of the emitter area of T10 to the emitter area of TL. This provides for current limiting and over current protection of the output transistors T10 and T11 in the event that the chip output pad is inadvertently shorted to a power supply voltage.

Figure 3:
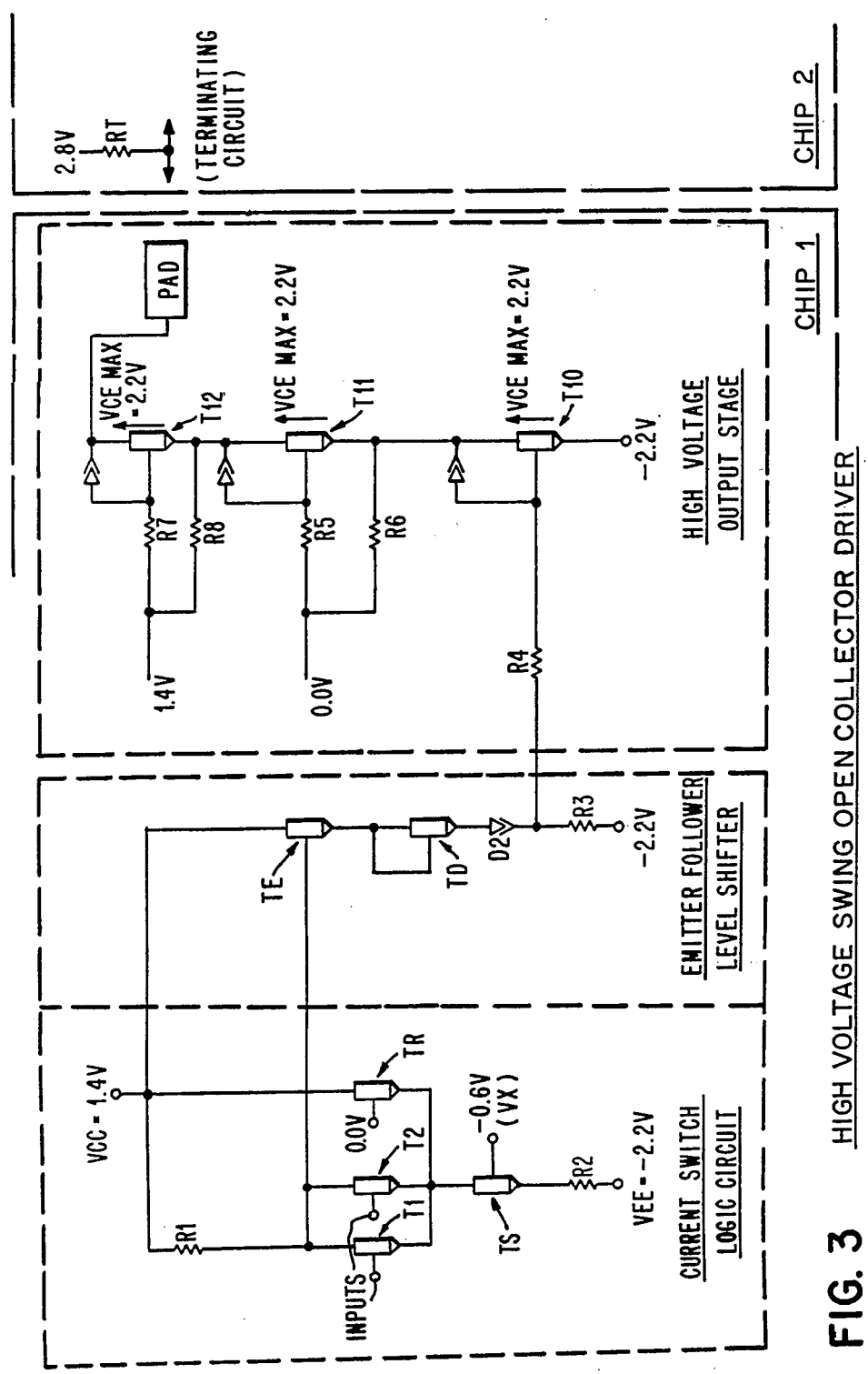
FIG. 3 discloses a third embodiment of a high voltage open collector driver in accordance with the invention.

In reference to the schematic diagram, FIG. 3; a third series transistor, T12, has been connected into the high voltage output stage. The chip pad is connected to the collector of T12. The off chip pad is connected to a terminator resistor connected in turn to a higher source of potential (+2.8 V). The emitter of T12 is connected to the collector of T11. The emitter of T11 is connected to the collector of T10. The emitter of T10 is connected to a source of potential (−2.2 V). The base of T12 is connected to a source of reference potential (+1.4 V) via a resistor R7. Resistor R8 connects the emitter of T12 to the source of reference potential (+1.4 V). As in FIG. 1, the base of T11 is connected to a source of reference potential (0.0 V) via a resistor R5. Resistor R6 connects the emitter of T11 to the source of reference potential (0.0 V). The base of T10 is connected via resistor R4 to the output of the emitter follower level shifter. A total of 5 V appears across the series connected output transistors.

Operation is similar to that described in reference to FIG. 1, with extension to incorporate the additional transistor T12. With no base current into transistor T10, transistors T10, T11 and T12 are off.
$V_{BE}$ of T10=0 V, $V_{CE}$ of T10=2.2 V,
$V_{BE}$ of T11=0 V, $V_{CE}$ of T11=1.4 V,
$V_{BE}$ of T12=0 V, $V_{CE}$ of T12=1.4 V.
Turning on transistor T10 results in the activation of transistors T11 and T12, drawing current from the terminator resistor connected to the output pad.
$V_{BE}$ of T10=0.8 V, $V_{CE}$ of T10=1.4 V,
$V_{BE}$ of T11=0.8 V, $V_{CE}$ of T11=1.4 V,
$V_{BE}$ of T12=0.8 V, $V_{CE}$ of T12=2.2 V,
The pad voltage will drop, activating in turn the anti-saturation SBD clamps on the output transistors T12, T11 and T10 until
$V_{BE}$ of T10=0.8 V, $V_{CE}$ of T10=0.2 V
$V_{BE}$ of T11=0.8 V, $V_{CE}$ of T11=0.2 V
$V_{BE}$ of T12=0.8 V, $V_{CE}$ of T12=0.2 V
and the output of the driver, the collector of T12, has moved 4.4 V with a maximum of 2.2 V appearing across any device. The same thing happens in reverse for turn-off.

It is apparent that the number of series connected transistors is not limited to the two or three described herein, but that the transistors may be connected in this manner in series in a sufficient number to provide for arbitrarily large output voltage swings while limiting the voltage appearing across any one of them.

Figure 4:
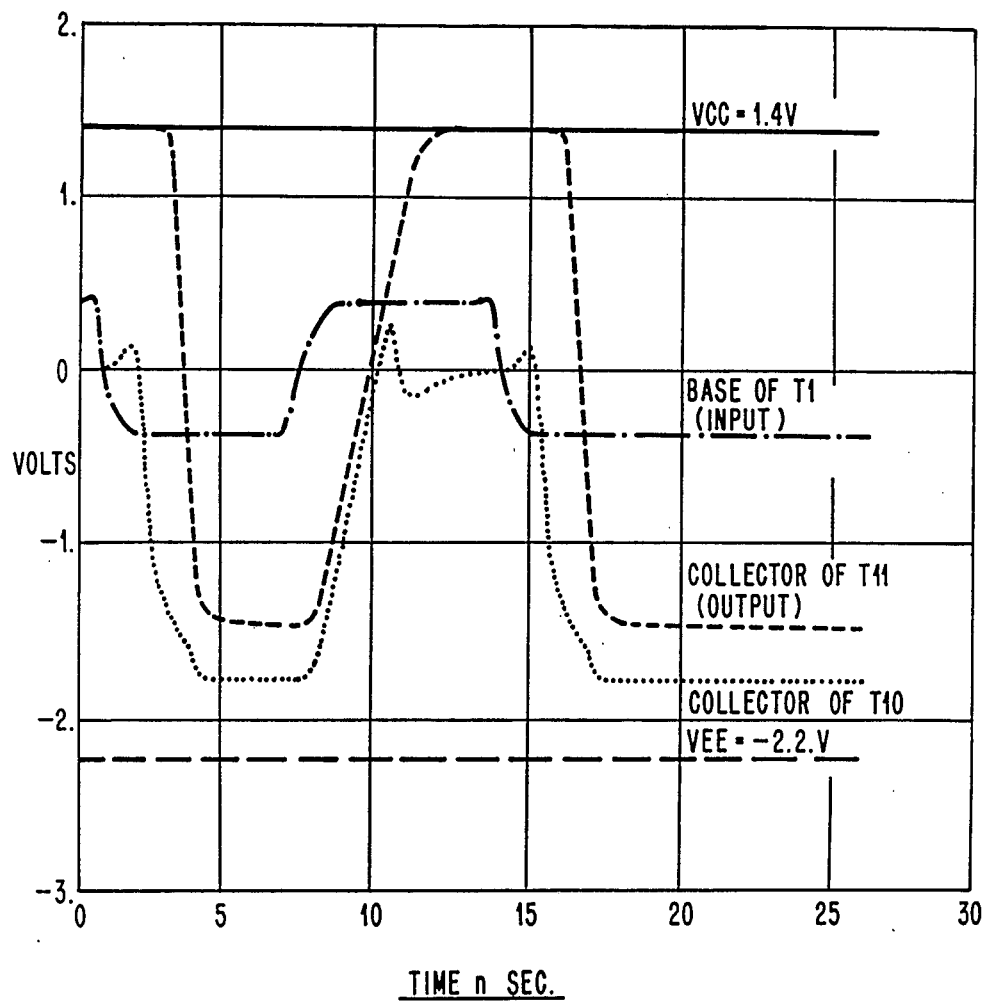
FIG. 4 discloses idealized waveforms to be viewed in conjunction with the high voltage swing open collector driver of FIG. 1 as an aid in understanding the explanation and operation thereof.

In reference to the idealized waveforms, FIG. 4, to be viewed in conjunction with the high voltage swing open collector driver of FIG. 1; the input signal applied to the base of transistor T1 is shown switching around 0 V. This causes the output, the collector of T11 to switch while maintaining voltage division across the output transistors T11 and T10 as shown by the T10 collector waveform. The power supply voltage $V_{CC}$ and $V_{EE}$ are shown for reference.

Figure 5:
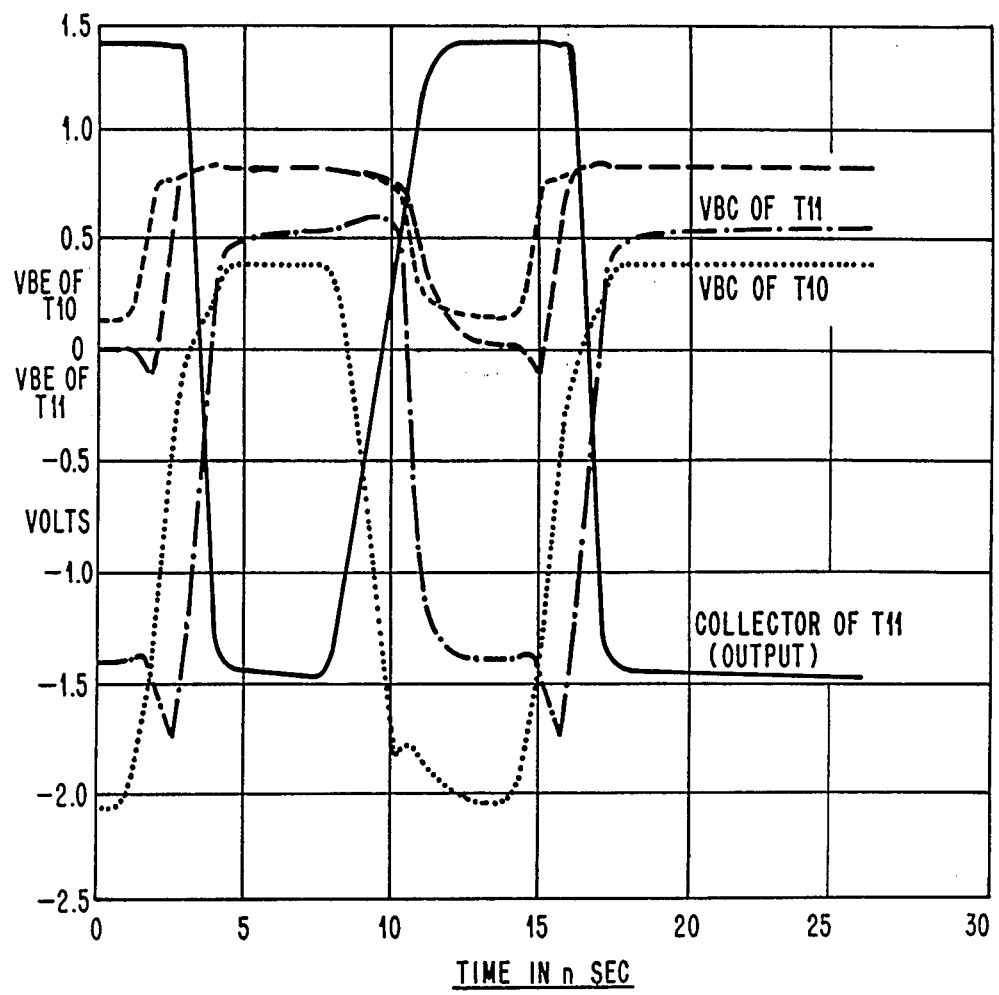
FIG. 5 discloses idealized waveforms to be viewed in conjunction with the high voltage swing open collector driver of FIG. 1 as an aid in understanding the explanation and operation thereof.

In reference to the idealized waveforms, FIG. 5, to be viewed in conjunction with the wave form of FIG. 4; the actual base-emitter voltage and the base-collector voltage for the series output transistors T10 and T11 are shown illustrating the maintenance of the voltage division during the switching interval.

Figure 6:
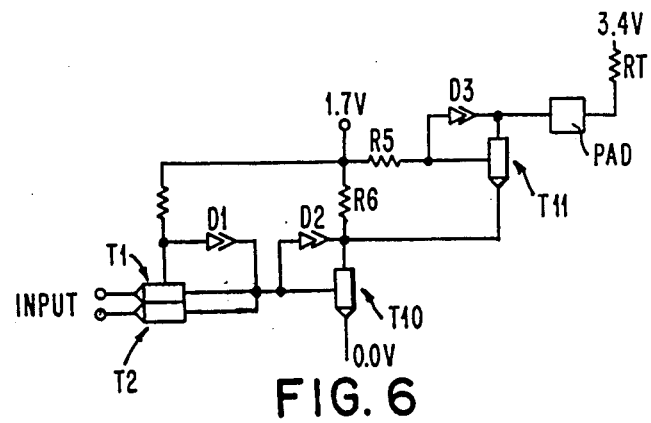
FIG. 6 discloses a further embodiment of high voltage swing open collector driver in accordance with my invention.

In reference to the schematic diagram, FIG. 6; it is to be recognized that the high voltage swing open collector driver need not be driven by a shifted emitter follower signal level out of a current switch logic circuit. Here is illustrated an example where the output series transistors, T10 and T11, are driven by a TTL type logic gate. The collector of the input TTL transistors T1 and T2 are connected to the base of the series output transistor T10. The input logic signals, applied to the emitters of the input transistors T1 and T2, cause the input transistors to become active in either the normal or the inverse mode. When the input transistors are active in the normal mode, there is no base current into the series output transistor T10. When the input transistor is active in the inverse mode, current flows into the base of the series output transistor T10. In the same manner as described in reference to FIG. 1, switching base current into transistor T10 is converted into an output voltage swing at the collector of T11 while maintaining the voltage split across series connected transistors T10 and T11.

While this invention has been particularly described with reference to the preferred embodiments thereof, it will be understood by those skilled in the art that the foregoing and other changes in form and details may be made therein without departing from the spirit and scope of the invention.

What is claimed is:

1. In an integrated circuit chip containing a plurality of high speed bipolar transistors, each of said transistors having a relatively narrow base-width whereby each of said high speed transistors has a relatively low $BV_{CEO}$ parameter, said integrated circuit chip including at least one off-chip driver circuit having a plurality of high speed bipolar transistors, said at least one off-chip driver including:
    input means for receiving an input signal having a voltage swing of k volts;
    output means coupled to and responsive to said input means for providing an output signal having a voltage swing of l volts where the magnitude of said output voltage swing l is materially greater then the magnitude of said input voltage swing k, said driver circuit being further characterized in that the magnitude of the output voltage swing of said driver circuit is materially greater than the voltage magnitude of the $BV_{CEO}$ parameter of the plurality of high speed bipolar transistors employed in the at least one off-chip driver circuit of the integrated circuit chip.

2. In an intergrated circuit chip containing a plurality of high speed bipolar transistors, each of said transistors having a relatively narrow base-width, whereby each of said high speed transistors has a relatively low $BV_{CEO}$ parameter, as recited in claim 1, wherein said output means of said driver circuit includes at least first and second serially connected high-speed transistors and each of said first and second serially connected transistors has a $BV_{CEO}$ parameter having a voltage magnitude materially less than the magnitude of the output voltage swing l of the driver circuit.

3. In an integrated circuit chip containing a plurality of high speed bipolar transistors, each of said transistors having a relatively narrow base-width, whereby each of said high speed transistors has a relatively low $BV_{CEO}$ parameter, as recited in claim 2, wherein said input means of said driver circuit includes,
    a logic circuit having at least first and second inputs and emitter-follower output means connected to the input of said output means of said driver circuit.

4. In an integrated circuit chip containing a plurality of high speed bipolar transistors, each of said transistors having a relatively narrow base-width, whereby each of said high speed transistors has a relatively low $BV_{CEO}$ parameter, as recited in claim 3, wherein said output means of said off-chip driver circuit includes:
    first and second transistors, said first and second transistors each including an emitter, base and collector, said emitter of said first transistor connected to said collector of said second transistor, said emitter of said second transistor connected to a first source of potential;
    a first resistor connected between said base of said second transistor and said emitter-follower output means of said logic circuit;
    a second resistor connected between a source of reference potential and the base of said first transistor;
    a third resistor connected between said source of reference potential and the emitter of said first transistor; and
    load circuit means contained on a second integrated circuit chip, said load circuit means connected between the collector of said first transistor and a second source of potential.

5. In an integrated circuit chip containing a plurality of high speed bipolar transistors, each of said transistors having a relatively narrow base-width, whereby each high speed transistor has a relatively low $BV_{CEO}$ parameter, as recited in claim 3, wherein said output means of said off-chip driver circuit includes:
    first, second and third transistors, each of said first, second and third transistors having an emitter, base and collector, said emitter of said first transistor connected to the collector of said second transistor, said emitter of said second transistor connected to the collector of said third transistor, said emitter of said third transistor connected to a first source of potential;
    a first resistor connected between said base of said third transistor and said emitter follower output means of said logic circuit;
    a second resistor connected between said base of said second transistor and a first source of reference potential;
    a third resistor connected between said emitter of said second transistor and said first source of reference potential;
    a fourth resistor connected between said base of said first transistor and a second source of reference potential;
    a fifth resistor connected between said emitter of said first transistor and said second source of reference potential; and
    load circuit means contained on a second integrated circuit chip, said load circuit means connected between the collector of said first transistor and a second source of potential.

6. In an integrated circuit chip containing a plurality of high speed bipolar transistors, each of said transistors having a relatively narrow base-width, whereby each high speed transistor has a relatively low $BV_{CEO}$ parameter, as recited in claim 4, or claim 5 wherein said logic circuit is a current switch circuit.

7. In an integrated circuit chip containing a plurality of high speed bipolar transistors, each of said transistors having a relatively narrow base-width, whereby each high speed transistor has a relatively low $BV_{CEO}$ parameter, as recited in claim 4, or claim 5 wherein said logic circuit is a TTL circuit.

8. In an integrated circuit chip containing a plurality of high speed bipolar transistors, each of said transistors having a relatively narrow base-width whereby each of said high speed transistors has a relatively low $BV_{CEO}$ parameter, said integrated circuit chip including at least one off-chip open collector driver circuit, said at least one off chip driver circuit including:
    current switch circuit means, said current switch circuit means having at least first and second inputs and an output;
    emitter follower circuit means, said emitter follower circuit means having an input and an output, said input of said emitter follower circuit means connected to the output of said current switch circuit means;

and output circuit means, said output circuit means including, first and second transistors, each of said transistors having an emitter, base and collector, said emitter of said first transistor connected to said collector of said second transistor, said emitter of said second transistor connected to a first source of potential, said collector of said first transistor connected to a chip output pad, a first resistor connected between said output of said emitter follower circuit means and said base of said second transistor, a second resistor connected between said base of said first transistor and a first source of reference potential, a third resistor connected between said emitter of said first transistor and said first source of reference potential, a first Schottky diode connected across the base collector junction of said first transistor, and a second Schottky diode connected across the base collector junction of said second transistor.

9. In an integrated circuit chip containing a plurality of high speed bipolar transistors, each of said transistors having a relatively narrow base-width whereby each of said high speed transistors has a relatively low $BV_{CEO}$ parameter, said integrated circuit chip including at least one off-chip open collector driver circuit, said at least one off chip driver circuit including:

current switch circuit means, said current switch circuit means having at least first and second inputs and an output;

emitter follower circuit means, said emitter follower circuit means having an input and an output, said input of said emitter follower circuit means connected to the output of said current switch circuit means;

and output circuit means, said output circuit means including, first, second and third transistors, each of said transistors having an emitter, base and collector, said emitter of said first transistor connected to said collector of said second transistor, said emitter of said second transistor connected to a first source of potential, said emitter of said third transistor connected to said emitter of said second transistor, said collector of said first transistor connected to a chip output pad, and a common connection between said collector of said third transistor, said base of said third transistor and said base of said second transistor a first resistor connected between said output of said emitter follower circuit means and said base of said second transistor, a second resistor connected between said base of said first transistor and a first source of reference potential, a third resistor connected between said emitter of said first transistor and said first source of reference potential, a first Schottky diode connected across the base collector junction of said first transistor, and a second Schottky diode connected across the base collector junction of said second transistor.

10. In an integrated circuit chip containing a plurality of high speed bipolar transistors, each of said transistors having a relatively narrow base-width whereby each of said high speed transistors has a relatively low $BV_{CEO}$ parameter, as recited in claims 8 or 9, wherein said emitter follower circuit means includes:

fourth and fifth transistors, each of said fourth and fifth transistors having a collector, base and emitter, said collector of said fourth transistor connected to a second source of potential, said base of said fourth transistor connected to said output of said current switch means, and a common connection between said emitter of said fourth transistor, said collector of said fifth transistor and said base of said fifth transistor;

a third Schottky diode connected between said emitter of said fifth transistor and said output of said emitter follower circuit means; and, a fourth resistor connected between said emitter of said output terminal of said emitter follower circuit means and said first source of potential.

11. In an integrated circuit chip containing a plurality of high speed bipolar transistors, each of said transistors having a relatively narrow base-width whereby each of said high speed transistors has a relatively low $BV_{CEO}$ parameter, said integrated circuit chip including at least one off-chip open collector driver circuit, said at least one off chip driver circuit including:

current switch circuit means, said current switch circuit means having at least first and second inputs and an output;

emitter follower circuit means, said emitter follower circuit means having an input and an output, said input of said emitter follower circuit means connected to the output of said current switch circuit means;

and output circuit means, said output circuit means including, first, second and third transistors, each of said transistors having an emitter, base and collector, said emitter of said first transistor connected to said collector of said second transistor, said emitter of said second transistor connected to said collector of said third transistor , said emitter of said third transistor connected to a first source of potential, said collector of said first transistor connected to a chip output pad, a first resistor connected between said output of said emitter follower circuit means and said base of said third transistor, a second resistor connected between said base of said second transistor and a first source of reference potential, a third resistor connected between said emitter of said second transistor and said first source of reference potential, a fourth resistor connected between said base of said first transistor and a second source of reference potential, a fifth resistor connected between said emitter of said first transistor and said second source of reference potential.

12. In an integrated circuit chip containing a plurality of high speed bipolar transistors, each of said transistors having a relatively narrow base-width whereby each of said high speed transistors has a relatively low $BV_{CEO}$ parameter, said integrated circuit chip including at least one open collector off-chip driver circuit, said at least one off chip driver circuit including:

at least first and second input terminals;

first, second and third transistors, said first transistor having at least first and second emitters, a base and a collector, said second and third transistors each having an emitter, base and collector, said first and second emitters of said first transistor being respectively connected to said input terminals, said collector of said first transistor connected to said base of said second transistor, said collector of said second transistor connected to said emitter of said third transistor, said emitter of said second transistor connected to a first source of potential;

a first resistor connected between said base of said first transistor and a second source of potential;

a second resistor connected between said collector of said second transistor and said second source of portential;

a third resistor connected between said base of said third transistor and said second source of potential;

a first Schottky diode connected across said base-collector junction of said first transistor;

a second Schottky diode connected across said base-collector junction of said second transistor;

a third Schottky diode connected across said base-collector junction of said third transistor; and an output terminal connected to said collector of said third transistor.

13. In an integrated circuit chip containing a plurality of high speed bipolar transistors, each of said transistors having a relatively narrow base-width whereby each of said high speed transistors has a relatively low $BV_{CEO}$ parameter, said integrated circuit chip including at least one open collector off-chip driver circuit, as recited in claim 12, wherein the potential differential between said first and second sources of potential is approximately 1.7 volts.

14. In an integrated circuit chip containing a plurality of high speed bipolar transistors, each of said transistors having a relatively narrow base-width whereby each of said high speed transistors has a relatively low $BV_{CEO}$ parameter, said integrated circuit chip including at least one off-chip driver circuit, said at least one off-chip driver circuit including:

input means for receiving at least one input signal having a voltage swing of k volts; and output means including at least one output transistor, said output means coupled to and responsive to said input means for providing an output signal having a voltage swing of l volts, where the magnitude of said output voltage swing l is materially greater then the magnitude of said input voltage swing k and the voltage of said $BV_{CEO}$ parameter, characterized by said output circuit means containing circuitry for precluding the voltage across said at least one output transistor from any time exceeding the voltage of said $BV_{CEO}$ parameter of said at least one output transistor.

15. In an integrated circuit chip containing a plurality of high speed bipolar transistors, each of said transistors having a relatively narrow base-width, whereby each of said high speed transistors has a relatively low $BV_{CEO}$ parameter, as recited in claim 14, wherein said output means of said driver circuit includes at least first and second serially connected high-speed transistors and each of said first and second serially connected transistors has a $BV_{CEO}$ parameter having a voltage magnitude materially less than the magnitude of the output voltage swing l of the driver circuit.

* * * * *